United States Patent [19]

Butler

[11] Patent Number: 4,697,151
[45] Date of Patent: Sep. 29, 1987

[54] METHOD AND APPARATUS FOR TESTING OPERATIONAL AMPLIFIER LEAKAGE CURRENT

[75] Inventor: Gregg A. Butler, Lawrence, Mass.
[73] Assignee: Analog Devices, Inc., Norwood, Mass.
[21] Appl. No.: 870,829
[22] Filed: Jun. 5, 1986
[51] Int. Cl.$^4$ ............................................. G01R 19/00
[52] U.S. Cl. .................................... 330/2; 324/123 R
[58] Field of Search ............................. 307/491, 494; 324/123 C, 123 R, 124; 330/2

[56] References Cited

U.S. PATENT DOCUMENTS 3,845,401 10/1974 Troiani et al. .......................... 330/2
3,989,959 11/1976 Renirie et al. ................... 307/491 X

OTHER PUBLICATIONS

Plassmann, Wilfred and Gloe, K. H., "Measuring Instrument for Op Amp Characteristics", *Elektronik*, v. 28, No. 5, pp. 66–69.

Primary Examiner—Eugene R. LaRoche
Assistant Examiner—Steven J. Mottola
Attorney, Agent, or Firm—Wolf, Greenfield & Sacks

[57] ABSTRACT

A circuit for measuring the leakage current of an electrometer amplifier 10 determines the leakage currents at both amplifier input terminals simultaneously by a method that eliminates the effects of the amplifier offset voltage as well as of the offset voltages and leakage currents of the amplifiers (22 and 40) used in the measurement. With no amp. under test present in the circuit, measurements are made of the outputs of the two test-circuit amplifiers (22 and 40). This results in quantities that indicate the required compensation for the offset voltages and leakage currents of the test-circuit amplifiers. From then on, measurements are made of the amplifier output voltages with an amp. under test present and the leakage currents at both input terminals of said amplifier 10 under test can be inferred from these second measurements by using the information obtained from the first set of measurements. Subsequent tests of other amplifiers under test can be made without re-measurement of the compensation information obtained with no amplifier under test present.

2 Claims, 1 Drawing Figure

METHOD AND APPARATUS FOR TESTING OPERATIONAL AMPLIFIER LEAKAGE CURRENT

BACKGROUND OF THE INVENTION

This invention relates to an instrument for measuring leakage currents in operational amplifiers. More specifically, it relates to a circuit that simultaneously senses the leakage currents at both input terminals of an electrometer operational amplifier while maintaining the amplifier under test in a linear closed-loop configuration.

Electrometer operational amplifiers are, by definition, capable of responding to electrical signals from sources having very high internal resistances, e.g. $10^{12}$ or more ohms. These amplifiers must therefore have correspondingly high input resistances. Equally important, the leakage currents generated by them at their input terminals must be very small, e.g. $10^{-12}$ or less amperes. Production testing of the amplifiers requires measurement of the leakage currents for each amplifier. In this context, repeatable measurements require a resolution of $10^{-14}$ amperes. These tests are difficult and time-consuming because of the small currents involved. Specifically, with such small currents it takes as much as several seconds for the necessary filter capacitances and stray capacitances in the measuring circuitry to charge up so that accurate readings can be taken. In addition, error currents due to stray leakage paths can degrade the accuracy of the test, making the design and layout of the input signal path crucial.

It is a principal object of the invention to provide a circuit for sensing the leakage currents of an electrometer amplifier in less time than was heretofore feasible. Further, this invention eliminates the need for relays in the signal path which are a prime source of stray leakage error.

A more specific object of the invention is to provide a circuit that is capable of relatively quick measurement of the leakage currents of an electrometer amplifier and yet is characterized by accuracy and repeatability of measurement.

Other objects of the invention will be in part obvious and will in part appear hereinafter.

SUMMARY OF THE INVENTION

The invention comprises circuitry that simultaneously measures the leakage currents at both of the input terminals of an electrometer amplifier. Accordingly, the filter capacitances in the circuit need to be charged only once for both measurements and this effectively reduces the time required by one half. The circuit comprises first and second measurement circuits each of which includes an electrometer sensing amplifier. Each sensing amplifier is connected in a current-to-voltage configuration for measurement of the current at one of the terminals of the electrometer amplifier being tested.

The input offset voltage and input leakage currents of the sensing amplifiers affect the output voltage of the sensing amplifiers. However, the circuit is arranged such that these characteristics can first be measured and then used to compensate the readings taken in measurements of the leakage currents of a series of amplifiers to be tested.

The output of one of the sensing amplifiers is also affected by the offset voltage of the amplifier being tested. This effect is eliminated by subtracting from that sensing-amplifier output another voltage that is correspondingly affected by that offset voltage, namely the output of the amplifier under test.

BRIEF DESCRIPTION OF THE DRAWING

The single drawing FIGURE is a diagram of a circuit, embodying the invention, for measuring the leakage currents of an electrometer amplifier.

DETAILED DESCRIPTION OF THE PREFERRED EMBODIMENTS

Figure 1:
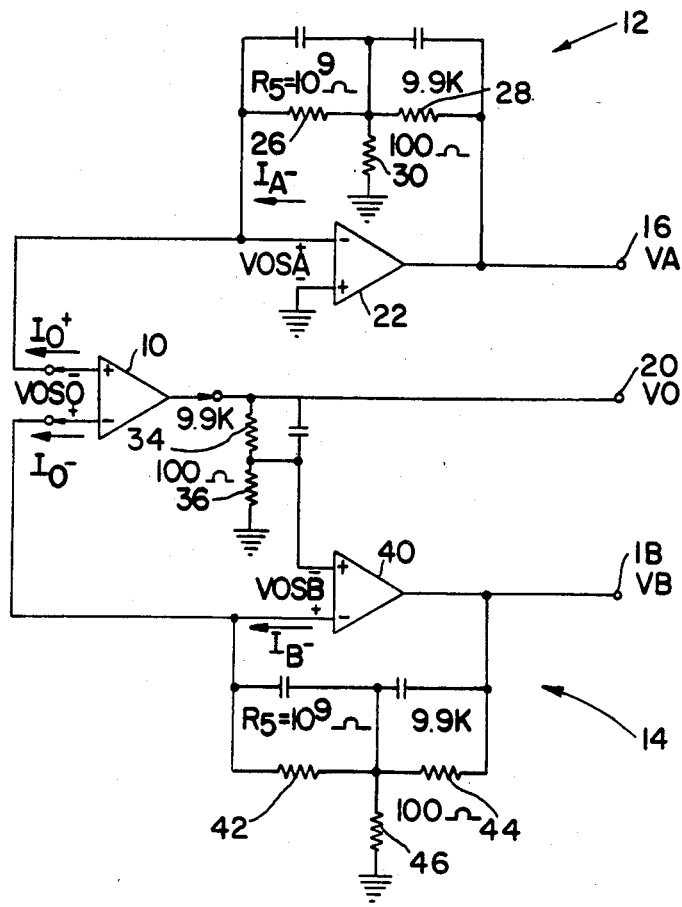

As shown in the drawing, a circuit for measuring electrometer leakage currents is connected to an amplifier 10 and measures the leakage currents at its input terminals. The leakage current at the non-inverting input terminal of amplifier 10 is sensed by a sensing circuit generally indicated at 12, and the leakage current at the inverting input terminal of amplifier 10 is sensed by a sensing circuit generally indicated at 14. The sensing circuit 12 provides an output voltage $V_A$ at a terminal 16. The sensing circuit 14 provides a second output voltage $V_B$ at a second terminal 18, and a third output voltage $V_0$ is measured at a third terminal 20 directly connected to the amplifier 10 to serve as an output terminal thereof. In combination, the voltages at these three terminals indicate the leakage currents at the input terminals of amplifier 10.

More specifically, sensing circuit 12 comprises an electrometer amplifier 22 whose non-inverting input terminal is connected to ground and whose inverting input terminal is connected to the non-inverting input terminal of the amplifier 10. A feedback network for amplifier 22 comprises a series resistor 26 and a voltage divider comprising resistors 28 and 30. Resistor 26 is connected between the inverting input terminal of amplifier 22 and the junction of resistors 28 and 30, while the other ends of resistors 30 and 28 are connected to ground and the output terminal of the amplifier 22, respectively.

Resistor 26 provides current-to-voltage conversion for the sensing circuit 12, since input current at the inverting input terminal of the amplifier 22 will, because of the high input resistance of amplifier, pass through the resistor 26 and be converted thereby to a voltage appearing at the output terminal 16. Since the currents to be sensed by the circuit are very low, the resistor 26 has a very high resistance $R_S$, e.g. $10^9$ ohms, to provide an appreciable voltage drop. A voltage divider comprising resistors 28 and 30 controls the gain, G, of the sensing circuit (e.g. $G=1+R28/R30=100$). The resistances of the resistors 28 and 30 are much less than that of the resistor 26; for example, resistors 28 and 30 may have resistances of 9.9K ohms and 100 ohms, respectively. Therefore, currents of the order of magnitude of those measured by the circuit develop negligible voltages across these resistors.

The sensing circuit 14 includes an electrometer amplifier 40 and an associated feedback network comprising resistors 42, 44, and 46, which can be identical with resistors 26, 28, and 30, respectively, of the sensing circuit 12. The inverting input terminal of amplifier 40 is connected to the inverting input terminal of amplifier 10. The non-inverting input terminal of amplifier 40 is connected to the tap of a voltage divider, comprising resistors 34 and 36, connected between ground and the output terminal of amplifier 10. Resistors 34 and 36 serve as gain-control resistors for amplifier 10.

From an inspection of the circuit one can see that, when an amplifier under test is present, the leakage current $I_{O+}$ at the non-inverting input terminal of amplifier 10 will pass through series resistor 26 and thereby be sensed by the sensing circuit 12. Similarly, the leakage current $I_{O-}$ at the inverting input terminal of amplifier 10 will pass through series resistor 42 so as to be sensed by the sensing circuit 14. However, the voltages at the output terminals 16 and 18 are also affected by other parameters, namely, the leakage currents of the amplifiers 22 and 40 and the offset voltages or amplifiers 10, 22 and 40. ($V_{OS}$ is defined as the residual voltage to which the potential difference between the input terminals of an amplifier is driven by negative feedback.) The effects of these other parameters are eliminated as follows.

Initially, measurements are made with no amplifier under test present. The inverting input terminal of the amplifier 22 is "floating," in the sense that it receives no input signal, although it is driven by the feedback network of amplifier 22. The output voltage $V_A$ at terminal 16 is thus a measure of the offset voltage, $V_{OSA}$, of the amplifier 22 and the leakage current $I_{A-}$ at the inverting input terminal of that amplifier. Specifically, $$V_A = (V_{OSA} - R_S I_{A-})G \quad (1)$$

The voltage $V_B$ at terminal 18 reflects the offset voltage $V_{OSB}$ of amplifier 40 as well as the leakage current $I_{B-}$ at the inverting input terminal of amplifier 40. Specifically, $$V_B = (V_{OSB} - R_S I_{B-})G \quad (2)$$

It should be noted that the resistance $R_{36}$ is sufficiently small that there is a negligible voltage drop aross this resistor due to the leakage current at the non-inverting-input terminal of the amplifier 40.

The quantities $V_A$ and $V_B$ are direct measures of the characteristics of the amplifiers 22 and 40 that affect the measurement of leakage currents of amplifier 10. These quantities are used, as will be presently described, in eliminating such effects from the measurements.

If an amplifier under test (amplifier 10) is now introduced to the measurement system as illustrated, the voltage $V'_A$ at terminal 16 is given by $$V'_A = (V_{OSA} - R_S I_{A-} - R_S I_{O+})G \quad (3)$$

The voltage $V'_B$ at terminal 18 is given by $$V'_B = (V_{OSA} + V_{OSO} - R_S I_{O-} - R_S I_{B-})G \quad (4)$$

The voltage $V_O$ at terminal 20 is given by $$V_O = (V_{OSA} + V_{OSO} - V_{OSB})G \quad (5)$$

Subtracting $V_O$ from $V'_B$, one obtains $$V_X = V'_B - V_O = (V_{OSB} - R_S I_{B-} - R_S I_{O-})G \quad (6)$$

Subtracting $V'_A$ and $V_X$ from $V_A$ and $V_B$, respectively, results in $$V_A - V'_A = GR_S I_{O+} \quad (7)$$

$$V_X - V'_B = GR_S I_{O-} \quad (8)$$

Finally, solving (7) and (8) for the leakage current yields $$I_{O+} = (V_A - V'_A)/GR_S \quad (9)$$

$$I_{O-} = (V_X - V_B)/GR_S \quad (10)$$

As can be seen, the subtractions to arrive at equations (7), and (8) eliminate the effects of the offset voltages and leakage currents of amplifiers 22 and 40, while the effect of the offset voltage of amplifier 10 is eliminated by the subtractions to arrive at equation (6). Also, it will be apparent that the measurement of both of the leakage currents of amplifier 10 involves only a single settling time after the amplifier under test has been connected into the circuit and the measurement has commenced. Although a separate settling time is required for the measurement of the quantities $V_A$ and $V_B$, this measurement need be performed only once to obtain the characteristics of amplifiers 22 and 40. After that, measurement of the leakage currents of a succession of amplifier 10 can be made without repeating the measurement of $V_A$ and $V_B$. Because of the relatively long settling time required for each meaurement, this essentially reduces by one-half the time required for these measurements. Further, neither relays nor switches are present in the measurement signal paths, thereby eliminating potential stray leakage from those sources.

What is claimed as new and desired to be secured by Letters Patent of the United States is:

1. A system for measuring the leakage currents of an electrometer amplifier, said circuit comprising:
A. a first sensing circuit for connection to a first input terminal of an amplifier to be tested, said first sensing circuit comprising:
   i. a first electrometer amplifier connected in a current-to-voltage configuration, the non-inverting input terminal of said first electrometer amplifier being connected to have a fixed potential relative to a common reference point;
B. a second sensing circuit comprising:
   i. a second electrometer amplifier connected in a current-to-voltage configuration;
   ii. a voltage divider for connection between the output terminal of the amplifier to be tested, if present, and said common reference point, the non-inverting input terminal of said second electrometer amplifier being connected to a tap on said voltage divider.

2. The system defined in claim 1 in which each of said electrometer amplifiers includes a feedback circuit comprising:
A. first resistor having one end connected to the inverting input terminal of the amplifier;
B. a second resistor connected between the first resistor and the output terminal of the amplifier; and
C. a third resistor connected between the said reference point and the junction of said first and second resistors, said first resistor having a relatively high resistance so as to convert small input currents at said inverting terminal to easily sensed voltages, said second and third resistors controlling the gain of the amplifier and having relatively small resistances so as to develop negligible voltages for currents through them of the order of magnitude of said leakage currents.

* * * * *